United States Patent [19]

Argintaru et al.

[11] Patent Number: 4,694,260
[45] Date of Patent: Sep. 15, 1987

[54] MICROWAVE DISCRIMINATOR AND DEVICES USING SAID DISCRIMINATOR

[75] Inventors: Lazare Argintaru, Le Pre Saint Gervais; Denis Hebrard, Levallois Perret, both of France

[73] Assignee: Alcatel Thomson Faisceaux Hertziens, France

[21] Appl. No.: 823,862

[22] Filed: Jan. 29, 1986

[30] Foreign Application Priority Data

Jan. 29, 1985 [FR] France ................................. 85 01207

[51] Int. Cl.$^4$ .......................... H03D 3/26; H03L 1/04; H03L 7/04
[52] U.S. Cl. .......................................... 331/9; 307/519; 329/116; 329/140; 329/204; 328/141; 331/69; 331/172; 331/176; 333/234; 333/235; 455/214
[58] Field of Search ...................... 331/9, 1 R, 69, 176; 329/116, 140, 142, 204, 205 R; 307/510, 514, 519; 328/140, 141; 455/214, 337, 208, 210, 308, 309; 333/219, 227, 229, 232, 234, 235

[56] References Cited

U.S. PATENT DOCUMENTS 3,742,390  6/1973  Stiglitz et al. ............................ 333/6
3,798,578  3/1974  Konishi et al. ........................ 333/234
4,019,161  4/1977  Kimura et al. ........................ 333/219

FOREIGN PATENT DOCUMENTS 1018480  10/1957  Fed. Rep. of Germany .
55-162634  12/1980  Japan ....................................... 331/9

OTHER PUBLICATIONS

"Ovens", James Knights Co., Sandwich, Illinois, received in Patent Office in Nov. 1963.

Primary Examiner—Siegfried H. Grimm
Attorney, Agent, or Firm—Sughrue, Mion, Zinn, Macpeak, and Seas

[57] ABSTRACT

A microwave frequency discriminator, i.e. an electronic device for directly transforming frequency modulation on a microwave carrier into a demodulated lower frequency signal. The discriminator is similar to a Travis discriminator and includes an inlet microstrip line, two resonant circuits ($R_1$, $R_2$) constituted by dielectric resonators and coupled to said inlet microstrip line to receive the modulated microwave signal, two outlet microstrip lines coupling each resonator to a respective microwave detector circuit, said detector circuits including loads ($r_1$, $r_2$) in series-opposition in the manner of a Travis discriminator.

7 Claims, 10 Drawing Figures

MICROWAVE DISCRIMINATOR AND DEVICES USING SAID DISCRIMINATOR

The present invention relates to a frequency discriminator, i.e. an electronic device for transforming a frequency modulated signal into a low frequency demodulated signal, said discriminator being for use with microwaves. The invention also relates to devices making use of such a discriminator.

BACKGROUND OF THE INVENTION

Generally speaking, a frequency discriminator is a device for transforming frequency modulation into a low frequency demodulated signal and is usable in several applications, of which the most common include Intermediate Frequency (IF) demodulation and Automatic Frequency Control (AFC) of an oscillator, in which the discriminator is also caused to operate at the intermediate frequency.

At such "intermediate" frequencies which are generally several tens of megahertz (MHz) in a microwave transmitter or receiver, for example, it is conventional to use a "Travis discriminator" comprising two oscillating circuits tuned to two different frequencies $F_1$ and $F_2$ situated on either side of the IF together with two diode detector circuits followed by respective filter circuits each including a capacitor connected in parallel with a load resistor. By connecting the two load resistors in series opposition (push-pull), and by taking the output voltage from across the terminals of the total load thus obtained, a voltage is obtained having the conventional amplitude-frequency characteristics $A(f)$ shown in accompanying FIG. 1. A signal $S_f$ carried by a carrier wave $F_i$ and frequency modulated is thus transformed into an amplitude modulated signal $F_a$ by means of a discriminator having a response curve $A(f)$ as shown diagrammatically in FIG. 1.

Microwave frequency discriminators have been implemented for a very long time, as can be seen from the book "Technique of Microwave Measurements" by C.G. Montgomery and published by McGraw-Hill Book Co., Inc., 1947, at pages 63 to 66. In those days the microwave circuits comprised magic-Ts, a metal microwave cavity, and waveguides having the property of reproducing an amplitude/frequency curve which is similar, at microwaves, to that of the Travis discriminator.

Such discriminators did not give rise to industrial implementations because they are difficult to make, bulky, expensive, and highly sensitive to temperature differences. These drawbacks had the effect of dissuading the person skilled in the art from using such circuits as demodulators or as AFCs, for example, and generally speaking as microwave discriminators. Indeed, over the last thirty years or so, these drawbacks have established a marked prejudice against such circuits so that frequency discriminators have been implemented in the path solely at IF.

Dielectric resonators for use with microwaves have been known since before 1940 (see "General of Applied Physics", Volume 10, June 1939, pages 391 to 398). Such dielectric resonators have been used since the beginning of the 60s in microwave applications: see in particular:

Proceedings IRE, Vol. 50, October 1962, pages 2081 to 2092;

IEEE transactions on Microwave Theory and Techniques, Vol. MTT-12, September 1964, pages 549 and 550; and IEEE Transactions on Microwave Theory and Techniques, Vol. MTT-13, March 1965, page 256.

More recently still, microwave oscillators have appeared in which the oscillator circuit is constituted by a dielectric resonator.

However, heretofore such facts have not been able to overcome the very marked prejudice of the person skilled in the art against using a frequency discriminator directly at microwave frequencies, and it has thus not occurred to the person skilled in the art that the very small size of a dielectric resonator could be used to implement a microwave discriminator which avoids the drawbacks of prior art microwave discriminators. It must also be added that dielectric resonators suffer from considerable temperature drift, as witnessed by the above-mentioned literature, and that the person skilled in the art is used to a frequency discriminator requiring an amplitude/frequency response curve which is particularly stable as a function of temperature.

Preferred embodiments of the present invention provide a microwave frequency discriminator which avoids the abovementioned drawbacks of prior art devices of this type.

SUMMARY OF THE INVENTION

The present invention provides a microwave frequency discriminator, comprising:

a microwave inlet circuit for a microwave to be discriminated;

a pair of microwave dielectric resonators having resonant frequencies $F_1$ and $F_2$ situated on either side of the frequency $F_0$ of the microwave to be discriminated;

a first microwave coupling device extending between said inlet circuit and each of said resonsators;

a pair of detector circuits;

respective microwave coupling devices extending between each of said resonators and corresponding respective ones of said pair of detector circuits, said detector circuits having output terminals which are connected in series-opposition in the manner of a Travis discriminator; and a discriminated microwave outlet taken from said output terminals of said pair of detector circuits.

More particularly, the present invention relates to a discriminator as defined above and comprising:

a protective enclosure;

a common substrate located in said enclosure;

said pair of dielectric resonators being placed on said substrate in the immediate proximity of a first microstrip also placed on said substrate and constituting said first microwave coupling device;

two second microstrips placed on said substrate in the immediate proximity of respective ones of said resonators and constituting said second microwave coupling devices; and said pair of microwave detectors loading respective ones of said second microstrips, each of said detectors being associated with a respective detector resistance.

The invention also provides an automatic frequency control (AFC) device for a microwave oscillator, said oscillator having an output for delivering an oscillation and a control input for receiving a frequency-controlling input signal, said AFC device comprising:

a microwave coupling device placed at the output from said oscillator; and a microwave frequency discriminator as defined above, said discriminator having a center frequency $F_0$ equal to the nominal frequency of said oscillator, the inlet to said discriminator being fed from said coupling device, and the outlet from said discriminator being connected to deliver a frequency-controlling signal to said oscillator control input.

In a particularly advantageous embodiment, such an AFC device has a microwave frequency discriminator in which the pair of resonators are such that their resonant frequencies vary in opposite directions with changes in temperature. This avoids the need for any ancilliary temperature correcting means.

The invention also provides a demodulator for frequency modulated microwaves, said demodulator comprising in succession:

a microwave amplitude stabilizer; and a microwave discriminator as defined above and including dielectric resonators.

In an advantageous embodiment of such a demodulator, said amplitude stabilizer comprises one or more series-connected units, each comprising:

a synchronized oscillator and a microwave circulator having at least three ports, namely:

a first port for receiving microwaves to be demodulated;

a second port in the direction of circulation, said second port being connected to output said received microwaves to said synchronized microwave oscillator, and also to receive oscillations output from said synchronized oscillator; and a third port in the direction of circulation for outputting amplitude-stabilized microwaves.

The invention also provides an amplitude stabilizer for microwave frequencies as defined above.

The invention additionally provides a receiver for frequency modulated microwaves, said receiver comprising in succession:

a filter device for filtering a carrier wave at a frequency which it is desired to receive; and a microwave demodulator as defined above.

Finally, the invention provides a multichannel receiver for frequency modulated microwaves, said receiver comprising in succession:

a filter for selecting a carrier wave at a desired frequency;

a microwave demodulator as defined above;

a device for generating a direct voltage equal to the direct voltage which is superposed, at the output from said demodulator, on the demodulated alternating voltage representative of the modulation carried by said carrier wave; and means for subtracting said generated direct voltage from the combined direct and alternating voltages available at said demodulator output.

Advantageously such a multichannel receiver is fitted with means for automatically selecting said desired frequency from said generated direct voltage.

In a particular embodiment such a multichannel receiver is fitted with means for automatically controlling said filter as a function of said generated direct voltage.

BRIEF DESCRIPTION OF THE DRAWINGS

Embodiments of the invention are described by way of example with reference to the accompanying drawings, in which.

MORE DETAILED DESCRIPTION

Figure 1:
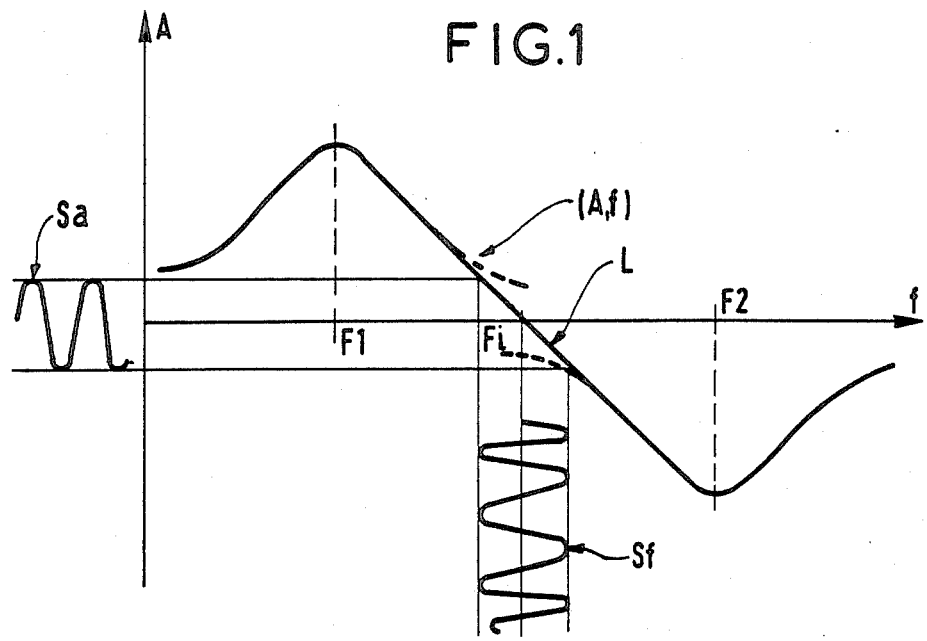
FIG. 1 is a voltage/frequency response curve of a Travis frequency discriminator.

FIG. 1, which has already been described above, shows a characteristics voltage(A)/frequency(f) response to a Travis discriminator. The useful portion of such a characteristic is the linear portion L lying between frequencies $F_1$ and $F_2$ to which the two resonant circuits used are tuned. Such a linear portion is conventionally characterized by its qualities of linearity and slope, which, as is well known to the person skilled in the art, are conflicting characteristics.

Figure 2:
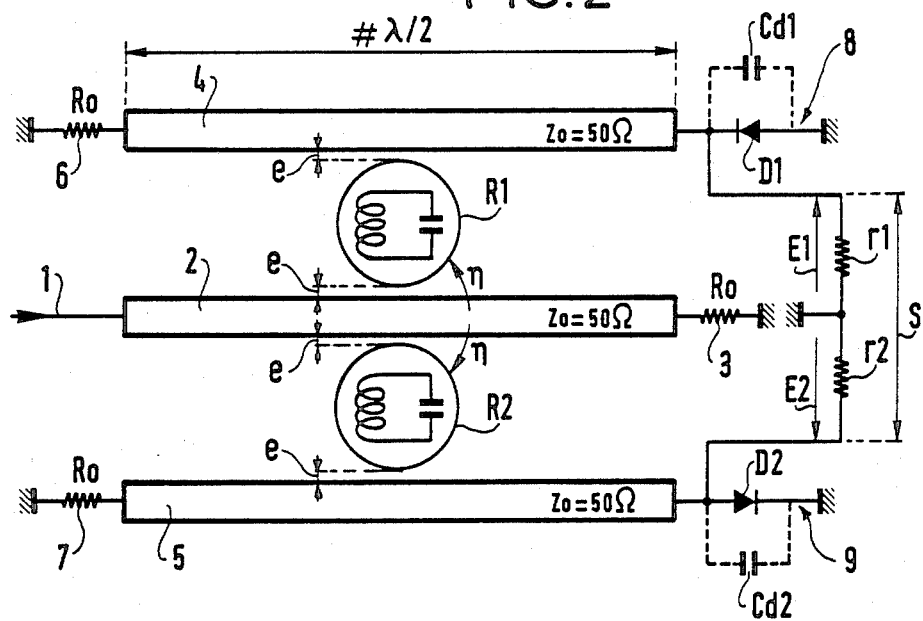
FIG. 2 is a circuit diagram of a microwave discriminator in accordance with the invention.

FIG. 2 is an electric circuit diagram of a microwave discriminator in accordance with the invention and is constituted by transposting to microwave frequencies a Travis discriminator such as is commonly used at very much lower frequencies. The transposition applies in particular to the use of dielectric resonators and of a microstrip line.

In FIG. 2, reference 1 designates the inlet to the discriminator of a frequency modulated microwave at Frequency $F_0$. For example the wave may have carrier frequency of 7 GHz which is frequently modulated using a modulation channel having a total bandwidth of 50 MHz. As can be seen in the drawing, this signal is received in a discriminator in accordance with the invention on a microstrip inlet line 2 whose length is approximately equal to one-half of the wavelength $\lambda_0$ of the inlet signal at frequency $F_0$, said strip having a characteristic impedance $Z_0$ of 50 ohms, by ways of typical example. The other end of the microstrip 2 is terminated by a terminating resistance 3 whose value $R_0$ is equal to 50 ohms and whose other end is connected to ground. In a variant, the inlet 1 could be coupled to two microstrip lines, each of them being terminated on a terminating resistance and with a power divider distributing power between the two input lines.

In accordance with the invention, the line 2 is coupled on either side to two dielectric resonators $R_1$ and $R_2$, e.g. made of zirconium titanate, with each of the resonators having the same coupling coefficient $\eta$ which depends on the small gap e (a few tenths of a millimeter) left between the line 2 at each of the resonators $R_1$ and $R_2$.

Each of the resonators $R_1$ and $R_2$ is tuned to a corresponding frequency $F_1$ (which is less than the frequency $F_0$) or $F_2$ (which is greater than the frequency $F_0$). For example, for a carrier frequency $F_0$ of 7 GHz as mentioned above, the frequency $F_1$ is equal to 6 GHz and the frequency $F_2$ is equal to 8 GHz, thereby giving a discrimination band ($F_2-F_1$) of approximately 2 GHz.

As can be seen in the drawing, each dielectric resonator $R_1$, $R_2$ is also coupled to a respective further microstrip line 4 or 5, said lines being identical to the inlet line 2 and each being terminated, as shown, at one of its two ends by a corresponding terminating resistance 6 or 7 whose value $R_0$ is equal to the characteristic impedance $Z_0$ of the line, i.e. 50 ohms in the present example.

In the example shown, the gap e left between each resonator $R_1$, $R_2$ and its associated second line 4, 5 is equal to the gap left between each of the resonators and the inlet line 2. Naturally, the gaps could be different if so required.

The other ends of the lines 4 and 5 are terminated on respective microwave detection circuits 8 and 9, each comprising a microwave detection diode $D_1$, $D_2$, connected between the corresponding end and ground and having a corresponding parallel stray capacitance $Cd_1$, $Cd_2$. In addition, respective load resistances $r_1$, $r_2$ having a value of a few kilohms for example are also connected between said other ends of the lines 4 and 5 and ground. Detected voltages $E_1$ and $E_2$ thus appear across the terminals of the load resistances $r_1$ and $r_2$, and if the output voltage S from the discriminator is taken, as shown, from across said other ends of the lines 4 and 5, these detected voltages are in series opposition.

The operation of the FIG. 2 discriminator is identical, after transposition to microwave frequencies, to the operation of a Travis discriminator, with the resonators $R_1$ and $R_2$ replacing the conventional inductance and capacitance resonators, thereby giving the FIG. 2 discriminator the same response curve as that shown in FIG. 1 with the lower frequency $F_1$ being equal to 6 GHz, with the upper frequency $F_2$ being equal to 8 GHz and with a middle frequency $F_i$ thus being equal to the frequency $F_0$, i.e. to 7 GHz in the present example.

Figure 3:
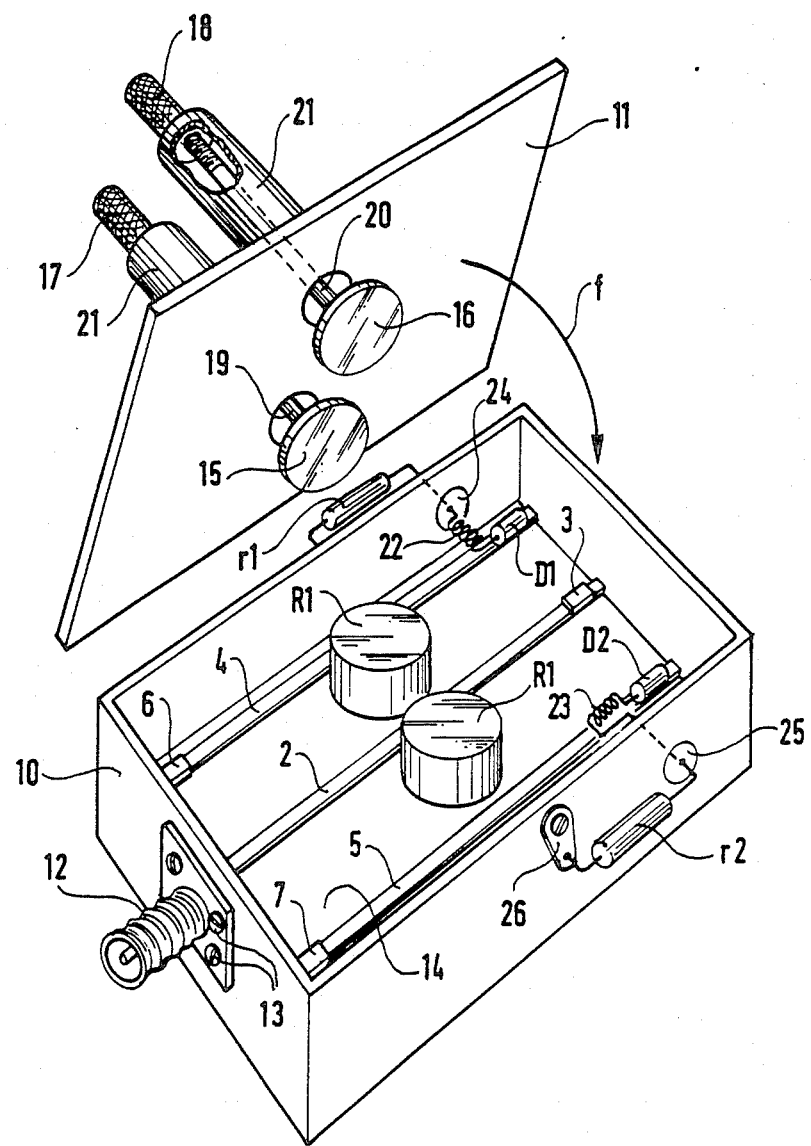
FIG. 3 is a partially cutaway perspective view of a practical implementation of the FIG. 2 discriminator.

FIG. 3 is a perspective view of a practical implementation of the FIG. 2 discriminator.

In FIG. 3, reference 10 designates a metal rectangular enclosure for receiving the discriminator in accordance with the invention and for being closed, as indicated by arrow f by a metal cover 11. The resulting box 11 constitutes ground for the device and is quite small at the 7 GHz frequency under consideration, e.g. it may be 25×25×20 millimeters.

The inlet 1 of FIG. 2 is constituted by a coaxial base 12 which is fixed to the box 11 by screws 13. The dielectric resonators $R_1$ and $R_2$ and the microstrip lines 5, 2, and 4 are glued to a common substrate 14 made of insulating material, e.g. alumina.

Advantageously, the dielectric resonators $R_1$ and $R_2$ are constituted by respective materials which, while both being zirconium titanate, for example, have respective thermal expansion coefficients which are equal and opposite to each other. This effect can be obtained by a chemical process which is widely known at the present time. For example, the resonator $R_1$ may expand with increasing temperature such that its resonant frequency $F_1$ decreases, while the resonator $R_2$ may shrink by the same amount with increasing temperature such that its resonant frequency $F_2$ increases by the same amount.

In conventional manner for dielectric resonators, metal plungers 15 and 16 mounted on the box cover 11 are positioned opposite respective ones of the resonators $R_1$ and $R_2$ and are capable of being moved towards or away from the resonators by means of associated knurled knobs 17 and 18. This serves to provide fine adjustment of the resonant frequencies $F_1$ and $F_2$ of each of the resonators $R_1$ and $R_2$.

Advantageously, each of the plungers 15 and 16 may be of the "mecanothermal" or temperature compensation type, for example as described in U.S. Pat. No. 3,528,042. In order to do this, the rod (19 or 20 as the case may be) of each of the plungers 15 and 16 is made of a material such as Invar or such as a metal-plated inert quartz which is inert as a function of temperature, i.e. which has a very small or completely negligible temperature expansion coefficient. Under such conditions, it appears that the metal tubular enclosure 21 of each plunger increases in length with increasing temperature while its associated rod (19, 20) does not increase in length, such that each plunger (15, 16) moves away from the associated dielectric resonator ($R_1$, $R_2$) thereby tending to increase the resonant frequency by an amount which is selected to cancel the reduction in reseonant frequency which could otherwise be expected from the increase in temperature.

This applies so long as both resonators ($R_1$, $R_2$) have identical temperature properties. In the particular case mentioned above where one of the resonators, e.g. $R_1$, is made of a material such that its resonant frequency decreases with increasing temperature while the other resonator, e.g. $R_2$, is made of a material such that its resonant frequency increases with increasing temperature, it is necessary for the second plunger, i.e. 16 in this example, associated with the second resonator $R_2$ should be made so that it moves closer to the resonator with increasing temperature, i.e. in the present example it could be carried by a rod 20 made of ordinary metal and contained in tubular enclosure 21 made of a thermally inert material.

FIG. 3 also shows detection diodes $D_1$ and $D_2$ which are connected as shown in FIG. 2, together with the terminating resistances 3, 6 and 7. As can be seen in the drawing, the diodes $D_1$ and $D_2$ are connected to their respective load resistances $r_1$ and $r_2$ via choke coils 22 and 23 and respective feedthroughs 24 and 25 which are insulated from the metal enclosure 10. As can be seen in the drawing, the other end of each of the load resistances $r_1$ and $r_2$ is soldered to a respective grounding tag such as 26.

Figure 4:
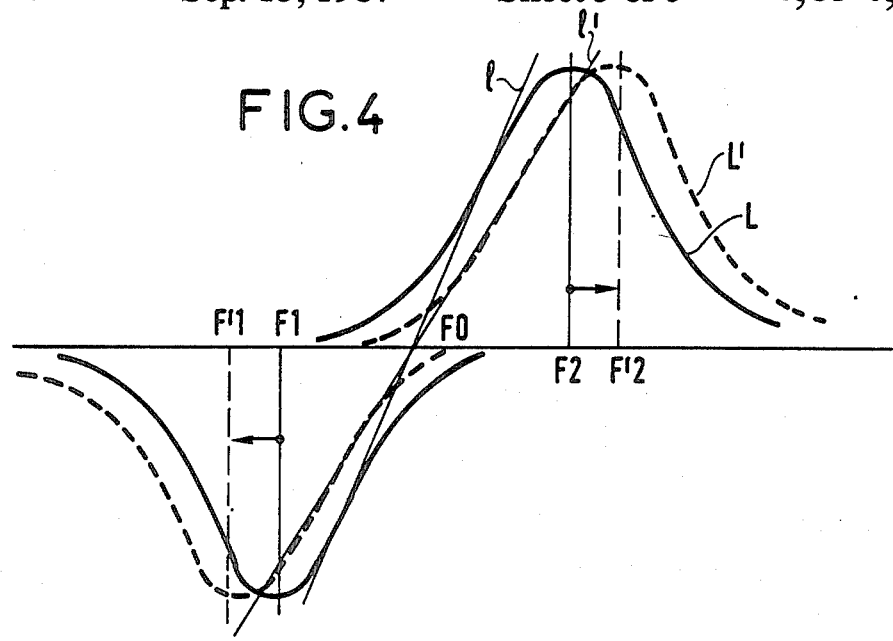
FIG. 4 shows the deformation of the response curve of the FIG. 3 discriminator as a function of temperature.

In an advantageous embodiment of the FIG. 3 discriminator, the dielectric resonators $R_1$ and $R_2$ are made of materials such that their resonant frequencies vary in opposite directions as a function of temperature. FIG. 4 is used to explain the advantageous effect which results from this special disposition.

In FIG. 4, the characteristic L obtained at ambient temperature (e.g. 20° C.) is drawn in solid lines, while the characteristics L' obtained at a temperature higher than ambient (e.g. 70° C.) is drawn in dashed lines. In the characteristic L' the resonant frequency $F_2$ of the resonator $R_2$ has been increased up to $F'_2$ and the resonant frequency $F_1$ of the resonator $R_1$ has been reduced by the same amount of $F'_1$. The linear portions situated between the two "humps" of each of the characteristics L and L' are shown by respective straight lines 1 and 1'.

As can be seen in FIG. 4, so long as the "humps" are moved symmetrically by increasing temperature, the center frequency $F_0$ remains unchanged. Only the slopes of the linear portions L and L' are different, and in some applications such as automatic frequency controlled (AFC) this is not of any great significance, as is explained below.

It may be observed that implementing a discriminator in accordance with the invention and as shown in FIG. 3 gives rise to a device which is very small. Under such conditions it is very easy to obtain temperature stabilization by placing the device in a thermostatically controlled enclosure, which is maintained at a constant temperature, e.g. 75° C. The resulting enclosure or oven may be very small and thus easy to install, and also consuming very little energy. The possibility of stabilization by means of a thermostatically controlled enclosure is practically inconceivable with bulky devices using metal cavities, magic-Ts, and waveguides as taught in the prior art, yet it becomes very practical with a small-sized device in accordance with the invention.

A microwave discriminator in accordance with the invention is suitable for use in several novel implementations which are particularly advantageous. By virtue of the very high Q factor inherent to dielectric resonators, its slope is considerably higher than that of the discriminators which are currently used at lower frequencies. For example the FIG. 3 embodiment gives a slope of 0.25 volts/MHz for frequencies $F_1$ and $F_2$ which are 20 MHz apart.

These high slope figures thus make it possible to provide automatic frequency control for a microwave oscillator in a simple manner since there is no need for frequency changing. Such an oscillator may, for example, by a high spectral purity oscillator such as a dielectric resonator oscillator or DRO.

Figure 5:
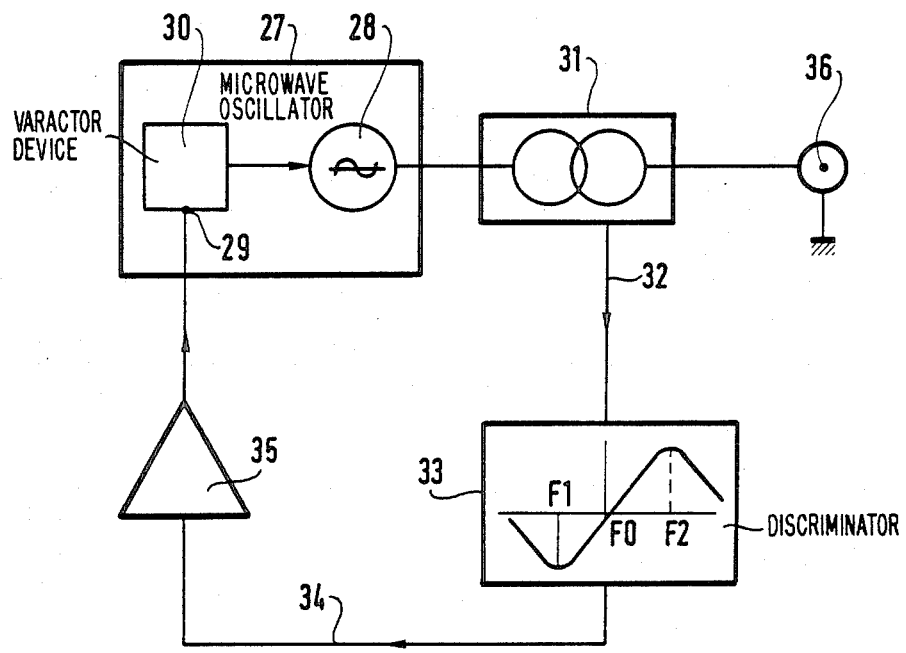
FIG. 5 is a block diagram of an automatic frequency control device in accordance with the invention for a microwave oscillator.

Further, the possibility of obtaining a very large difference between the extreme discrimination frequencies $F_2$ and $F_1$ in a discriminator in accordance with the invention, e.g. 2 GHz, makes it possible to obtain an automatic frequency controlled device which always converges regardless of temperature variations. It is thus possible to eliminate the searching devices which have previously been necessary in AFC devices, which searching devices are particularly complex and expensive. FIG. 5 is block diagram of an AFC for a microwave oscillator in accordance with the invention.

In this figure, reference 27 designates an oscillator, e.g. a DRO, designed to oscillate at a frequency $F_0$ of 7 GHz, for example. In conventional manner, this oscillator comprises an oscillating circuit 28 whose frequency is controllable by an externally applied direct voltage which is applied at 29 to a controlled circuit 30, e.g. a circuit including varactor diodes.

The output from the oscillator 27 is connected to a microwave coupler 31 at a few dBm for extracting a small amount of power at 32, e.g. about 2 milliwatt. This power is supplied to the input of a discriminator 33 having dielectric resonators with a center frequency $F_0$ such as the discriminator shown in FIG. 3 which is equipped with resonators having equal and opposite temperature variations. If the frequency of the wave applied at 32 to the discriminator 33 moves away from the frequency $F_0$, the discrimiator 33 provides an error voltage at 34 which is positive or negative depending on the sign of the error, and this voltage is applied via an analog level changing amplifier 35 to the control input 29 of the varactor device 30, thereby returning the frequency of the oscillator 27 to its nominal value $F_0$. A signal at a constant frequency $F_0$ is thus obtained at the output 36 from the circuit as a whole.

Figure 6:
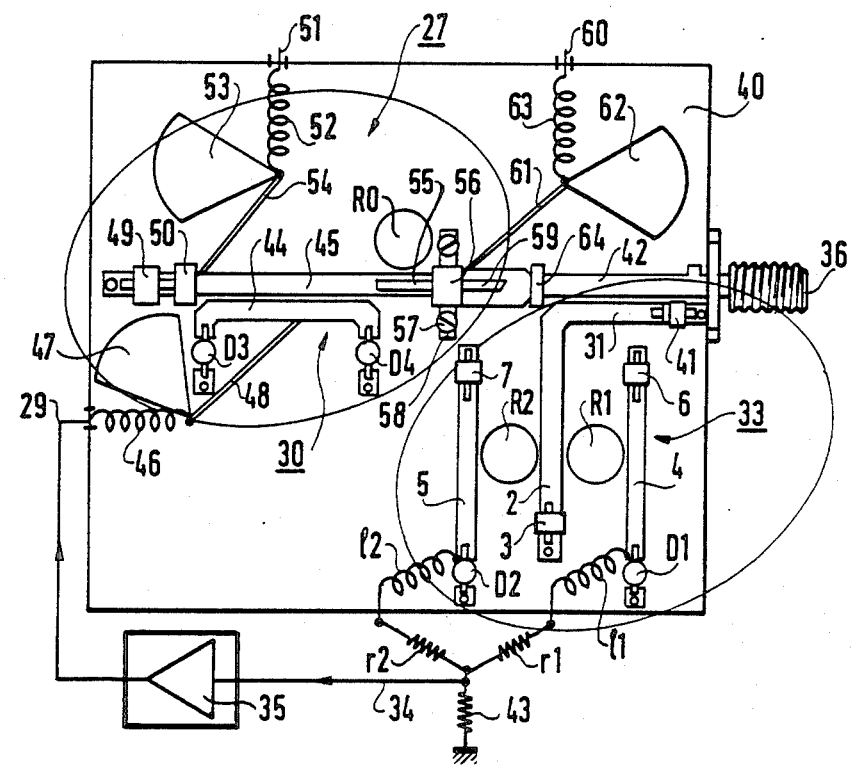
FIG. 6 is a diagram of a specific embodiment of the FIG. 5 device.

FIG. 6 illustrates an example of a practical embodiment of the circuit shown in FIG. 5.

As can be seen in the drawing, both the oscillator 27 (surrounded by an ellipse in the drawing) and the discriminator 33 (also surrounded by an ellipse in the drawing) are placed on a common substrate 40 which is made of insulating alumina, for example. For maximum clarity, the references which correspond to items that appear in FIGS. 2 and 5 have been repeated unchanged in FIG. 6 and the corresponding items are therefore not described a second time. The discriminator 33 used in this case is thus identical to the discriminator shown in FIG. 2, except for the low frequency choke coils $s_1$ and $s_2$ which were added in FIG. 2 between the diodes $D_1$ and $D_2$ and the associated resistances $r_1$ and $r_2$.

The coupler 31 is constituted by a microstrip line which is terminated by a matching resistance 41 which is placed, as shown, close to the output microstrip line 42 from the microwave oscillator 27, with the degree of coupling depending on the power level of the output from the oscillator 27.

The output 34 from the discriminator 33 is taken in this case across the terminals of a resistance 43 which is star connected with the resistances $r_1$ and $r_2$. This is a slightly different arrangement to that described with reference to FIG. 2, but the result is electrically the same.

The output from the low frequency amplifier 35 (e.g. an operational amplifier) is connected at 29 to the control circuit 30 for controlling the frequency of the oscillator 27 as a function of a voltage. In conventional manner, this circuit comprises two varactor diodes $D_3$ and $D_4$ which are interconnected by a microstrip line 44 which is itself coupled to the microstrip "coupling" line 45 of the oscillator 27. In a manner which is entirely conventional in microwave circuits, the inlet 29 is connected to the microstrip line 44 by means of a microwave and low frequency decoupling circuit comprising a low frequency choke 46, a microwave quarter wavelength trap 47, and a high impedance quarter wavelength line 48. The two varactor diodes $D_3$ and $D_4$ are used in conventional manner for increasing the linearity of the slope of the oscillator 27.

As shown in the drawing, the line 45 is terminated at one of its ends on a matching resistance 49 via a decoupling capacitance 50 having a value of a few picofarads, for example. the DC bias voltage for the base 55 of the transistor 56 in the oscillator 27 is also applied to the same end of the line 45 from a feed point 51 and via an additional decoupling circuit likewise including a low frequency choke 52, a quarter wave trap 53, and a quarter wave line 54.

The microstrip line 45 at base 55 is coupled, in a conventional manner, to a dielectric resonator $R_0$ whose resonant frequency is equal to the frequency $F_0$ of the oscillator 27, i.e. to 7 GHz in the present example.

The transistor 56 (or any other suitable active electronic device, such as a field effect transistor—FET) has its collector connected to ground via fixing screws 57 and a clamp 58, while its emitter 59 is connected firstly to a DC bias voltage applied at 60 via a quarter wavelength line 61, a trap 62 and a choke 63, and also via an additional decoupling capacitance 64 to the output microstrip line 42, which is in turn connected at its other end to the output connector 36 of the oscillator.

In accordance with another aspect of the invention, a discriminator in accordance with the invention may be used in association with a microwave level limiter to directly provide a microwave demodulator for frequency modulated microwaves. The limiter may either by a conventional microwave level limiter or else it may be a completely novel microwave level limiter as described below. Demodulation is provided much more simply when performed directly than when performed at an intermediate frequency as is the conventional case, and such direct demodulation makes it possible, advantageously, to avoid many of the well-known problems of non-linearity which are introduced at the intermediate frequency by the "limiting" diodes commonly used. Further, the microwave limiter, and in particular the novel type of limiter which is described below, may also be used to provide automatic gain control (AGC), thereby providing additional simplification.

Figure 7:
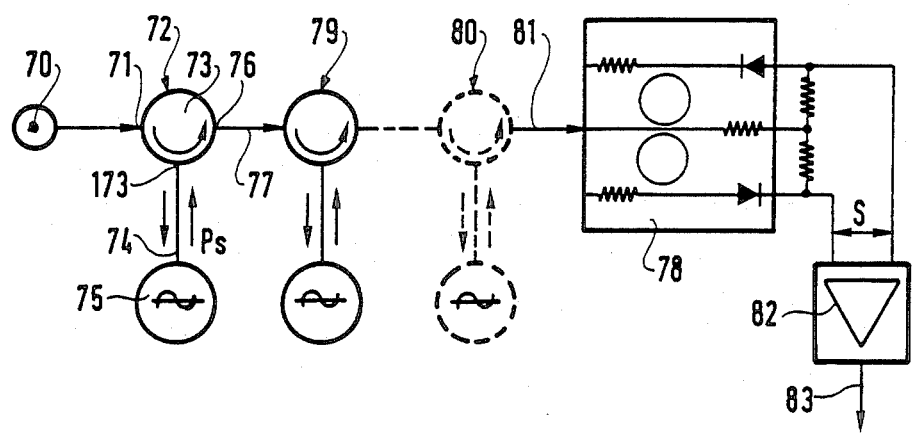
FIG. 7 is a diagram of a demodulator in accordance with the invention for a frequency modulated microwave.

Reference is now made to FIG. 7 which is a diagram of a microwave demodulator in accordance with the invention for demodulation a frequency modulated microwave.

The microwave having a carrier frequency $F_0$ of 7 GHz, for example, which is frequency modulated over a bandwidth of 50 MHz, for example, is applied to the demodulator in accordance with the invention at 70. This wave is applied to the inlet 71 of a first stage 72 of a novel type of microwave amplitude stabilizer which also acts as an AGC device.

The stabilizer 72 comprises a three channel microwave circulator 73, e.g. a ferrite circulator. The signal is applied at 71 to the first inlet channel. It leaves via the following outlet 173 in the direction of circulation and is applied by a line 74 to the frequency control input of a conventional synchronized oscillator 75 which therefore retransmits a wave at the frequency $F_0=7$ GHz over the line 74 towards the circulator 73. The retransmitted wave is of absolutely constant power $P_s$ which is a function only of the oscillator 75. this wave of defined frequency $F_0$ and power $P_s$ passes through the circulator 73 in the direction indicated by the arrow, and leaves via the second outlet 76 to follow a line 77 either directly to the discriminator 78, or preferably to a second amplitude stabilizer 79 which is similar to the stabilizer 72 but which has a higher output power in order to increase the dynamic range over which stabilization and AGC can be performed. More than two stabilizing stages such as 72 and 79 are indicated in the figure, and the last stage which defines the input power applied to the discriminator 78 is shown in dashed lines 80.

A circuit 72 comprising a synchronized oscillator 75 and a circulator 73 thus serves, in accordance with the invention, to provide a microwave amplitude stabilizer, which stabilizer has the additional advantage of operating as an automatic gain control circuit. It should be observed that such a circuit 72 comprising a circulator 73 and an oscillator 75 is known per se, i.e. as a circuit for synchronizing a synchronized microwave oscillator. The invention thus consists in using this known circuit as an amplitude stabilizer, and consequently as an AGC, at microwave frequencies.

The compressed signal at the output from the last stabilizer stage 80 is thus applied at 81 to the input of the dielectric resonator discriminator 78, which is a discriminator such as described above with references to FIGS. 2 and 3, for example. The output S for the demodulated wave is applied, as shown to an output amplifier, with the said low frequency wave which is directly demodulated without passing via an intermediate frequency being made available at 83.

Figure 8:
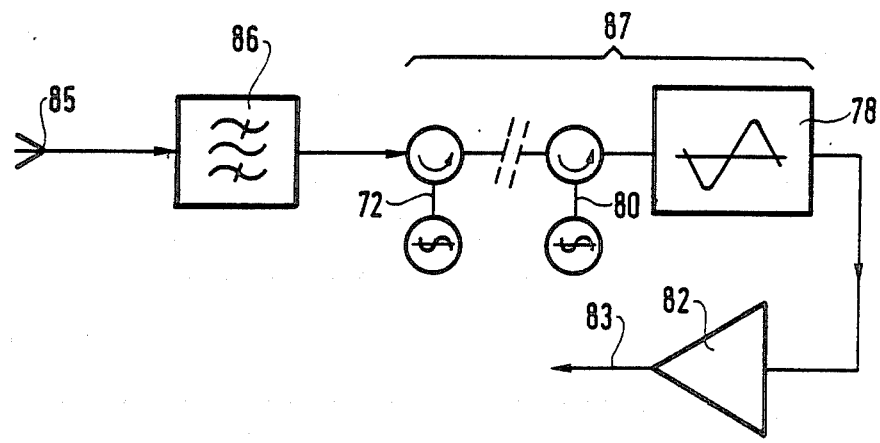
FIG. 8 is a block diagram of a receiver in accordance with the invention for a frequency modulated microwave.

FIG. 8 is a diagram of a single channel microwave receiver in accordance with the invention and operating, for example, at 7 GHz±25 MHz.

As can be seen in the drawing it comprises, in order:
a microwave inlet 85 for receiving microwaves from an antenna, for example;
a channel filter 86 tuned to the channel to be received;
a microwave demodulator 87, identical to the FIG. 7 demodulator and therefore not described in greater detail; and
a low frequency output amplifier 82.

Figure 9:
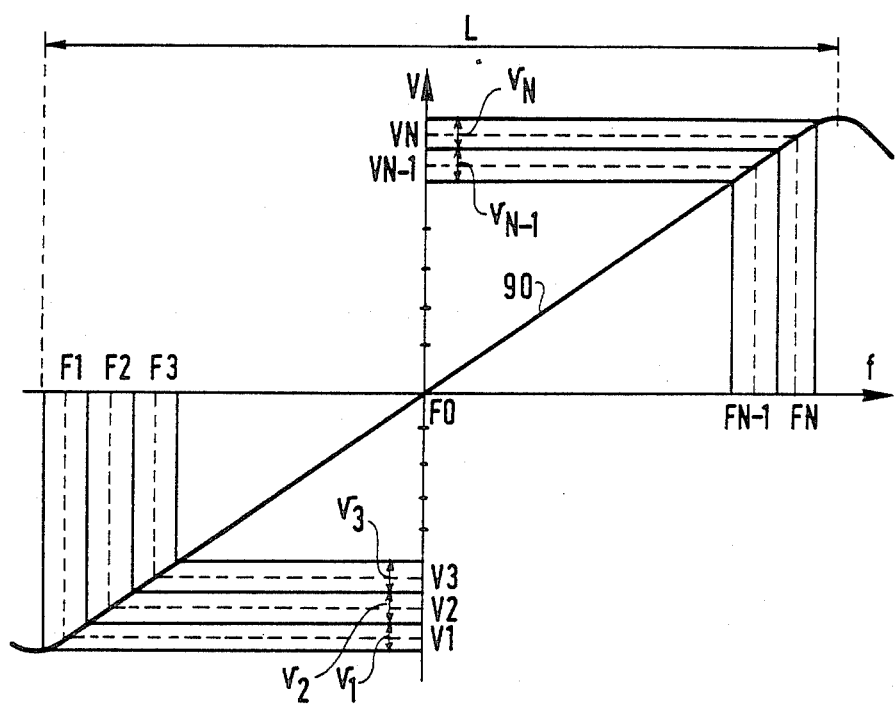
FIG. 9 is a diagram for explaining the possibility of multi-channel reception using a discriminator in accordance with the invention.

Reference is now made to FIG. 9 which is used to explain a last aspect of the invention enabling a demodulator in accordance with the invention to provide a simple implementation of a microwave multichannel receiver.

FIG. 9 shows the voltage(V)/frequency(f) response characteristic 90 of a microwave discriminator in accordance with the invention centered on a frequency $F_0=7$ GHz for example and having a useful bandwidth L of 2 GHz, for example.

If such a discriminator is to be used in a demodulator in a multichannel receiver, it can be seen that it is possible to demodulate a very large number of channels. In the present example, supposing each channel has a frequency bandwidth of 50 MHz, the discriminator with its usable frequency bandwidth L equal to 2 GHz is capable of demodulating 40 successive adjacent channels. In FIG. 9, the successive channels are are: channel 1, chanel 2, channel 3, . . . , channel N−1, channel N, and they correspond to successive carrier frequencies $F_1, F_2, F_3, \ldots, F_{N-1}, F_N$ Except for the frequency $F_0$, the output of the demodulator will provide, as can be seen in FIG. 9, both a DC voltage $V_1, V_2, V_3, \ldots, V_{N-1}, V_N$ for each channel on which an AC voltage $v_1, v_2, v_3, \ldots, v_{N-1}$, is superposed as demodulated from the corresponding channel 1, 2, 3, . . . , N−1, N.

In accordance with the invention, a corresponding DC voltage $V_1, V_2, \ldots, V_N$ is generated elsewhere as a function of the frequency $F_1, F_2, \ldots, F_N$ of the channel 1, 2, . . . , N under consideration. This DC voltage, e.g. $V_1$, is then subtracted from the corresponding demodulated voltage $V_1+v_1$ in order to obtain the required low frequency voltage $v_1$. In an advantageous implementation of the invention the DC voltage such as $V_1$ is also used to provide automatic selection of the frequency, e.g. $F_1$, of the channel to be received.

Figure 10:
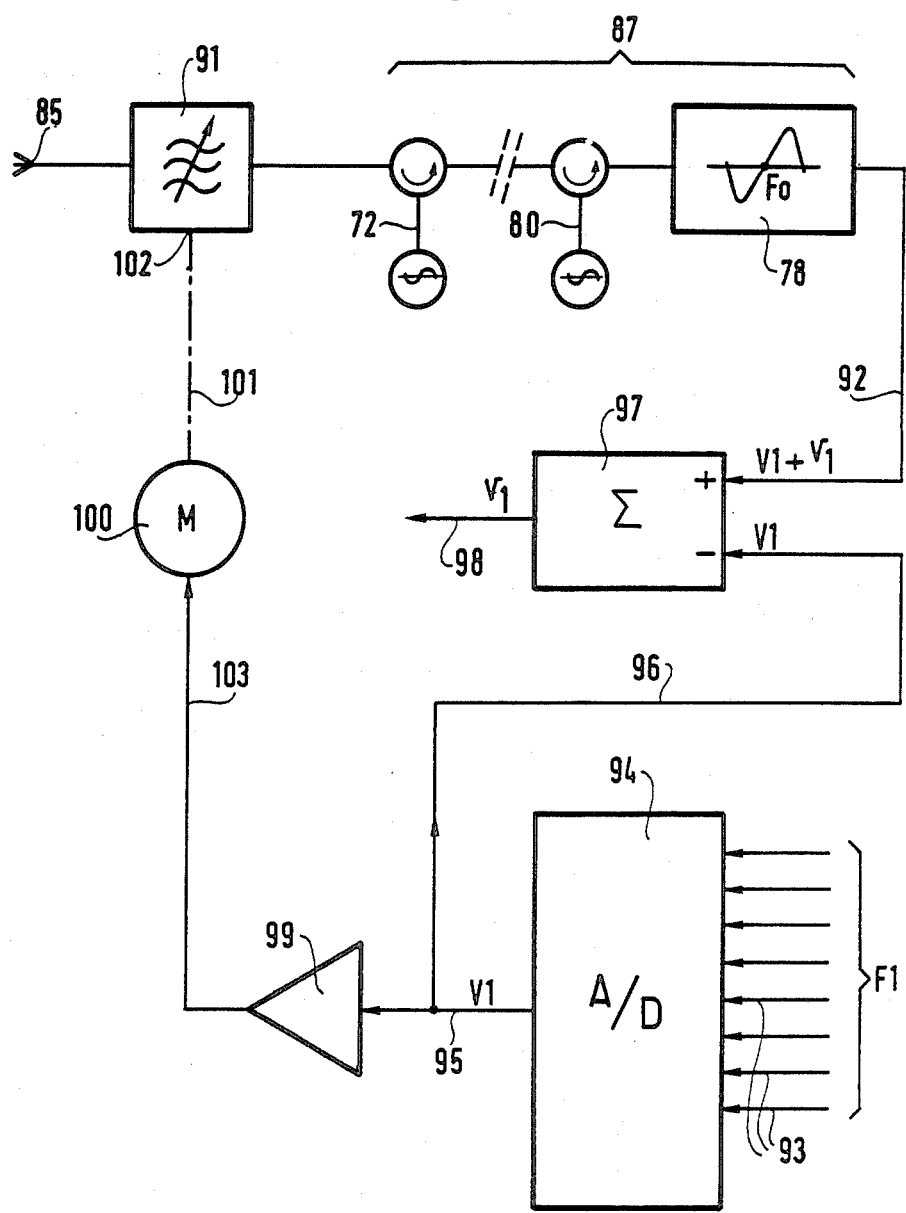
FIG. 10 is a block diagram of a multi-channel receiver in accordance with the invention for frequency modulated microwaves.

FIG. 10 is a diagram of a multichannel receiver operating as described above.

This figure uses the same inlet line 85 for the channel signal from the receiver antenna. The signal passes through a mechanically tunable channel filter 91 and is then applied to a microwave demodulator 87 which is identical to that described above with reference to FIG. 7. The demodulator provides a demodulated voltage at 92 which is equal, as has been explained with reference to FIG. 9, to the sum of a DC voltage $V_1$ and an AC voltage $v_1$ corresponding to the received channel which is at the frequency $F_1$ in the present example.

Further, a digital signal constituted by a byte representative of the frequency $F_1$ to be received is applied in parallel to the eight input lines 93 of a digital to analog converter 94 which converts the 8 bits of the byte into a DC voltage of amplitude equal to $V_1$ on its output 95.

The voltage $V_1$ at 95 is applied firstly via a line 96 to the negative terminal of an analog summing circuit 97 whose positive terminal receives the demodulated voltage $V_1+v_1$ via the line 92 from the demodulator 87. The output 98 of the subtractor constituted by the summing circuit 97 thus provides a signal constituted by the low frequency AC component $v_1$ of the demodulated voltage. The DC voltage $v_1$ available at 95 is also applied at 103 via a power level shifting amplifier 99 to a DC stepper motor 100 whose shaft is mechanically connected by a rod 101 to the mechanical inlet member for controlling the adjustment of the filter 91. The items 100 to 103 are mechanically and electrically adjusted so that when the DC voltage $V_1$ is applied at 103, the motor 100 turns through an angle suitable for setting the rod 101 so that the filter 91 selects the frequency $F_1$.

We claim:

1. A microwave frequency discriminator, comprising:
   a microwave inlet circuit for a microwave to be discriminated;
   a pair of microwave dielectric resonators having resonant frequencies $F_1$ and $F_2$ situated on either side of the frequency $F_0$ of the microwave to be discriminated, said resonators being made of respective materials such that the resonant frequencies of said resonators tend to vary in opposite direction with changing temperature;
   a first microwave coupling device extending between said inlet circuit and each of said resonators;
   a pair of detector circuits;
   respective microwave coupling devices extending between each of said resonators and a corresponding respective one of said pair of detector circuits, said detector circuits having output terminals which are connected in series-opposition in the manner of a Travis discriminator; and
   a discriminated outlet being taken from said output terminals of said pair of detector circuits.

2. A discriminator according to claim 1, comprising:
   a protective enclosure;
   a common substrate located in said enclosure;
   a first microstrip placed on said common substrate;
   said pair of dielectric resonators placed on said substrate in the immediate proximity of said first microstrip and constituting said first microwave coupling device;
   two second microstrips placed on said substrate in the immediate proximity of respective ones of said resonators to the opposite sides of said resonators from said first microstrip, and constituting second microwave coupling devices; and
   said pair of detector circuits loading respective ones of said second microstrips, each of said detector circuits being operatively coupled with a respective detector resistance.

3. A discriminator according to claim 2, wherein said enclosure carries a pair of axially shiftable metallic plungers operatively positioned facing said resonators, respectively for adjusting their resonant frequency and means for adjusting the positions of said metallic plungers facing said resonators.

4. A discriminator according to claim 3, wherein each of said metallic plungers is mounted on a mechanothermal compensation device tending to stabilize the resonant frequency of the associated resonator with varying temperature.

5. A discriminator according to claim 1, wherein said discriminator is placed inside an enclosure whose temperature is thermostatically controlled.

6. An automatic frequency control (AFC) device for a microwave oscillator, said oscillator having an output for delivering an oscillation and a control input for receiving a frequency-controlling input signal, said AFC device comprising:
   a microwave coupling device placed at the output from said oscillator; and
   a microwave frequency discriminator comprising:
   a microwave inlet circuit for a microwave to be discriminated;
   a pair of microwave dielectric resonators having resonant frequencies $F_1$ and $F_2$ situated on either side of the frequency $F_0$ of the microwave to be discriminated, said resonators being made of respective materials such that the resonant frequencies of said resonators tend to vary in opposite directions with changing temperature;
   a first microwave coupling device extending between said inlet circuit and each of said resonators;
   a pair of detector circuits;
   respective microwave coupling devices extending between each of said resonators and a corresponding respective one of said pair of detector circuits, said detector circuits having output terminals which are connected in series-opposition in the manner of a Travis discriminator; and
   a discriminated outlet being taken from said output terminals of said pair of detector circuits, said discriminator having a center frequency $F_0$ equal to the nominal frequency of said oscillator, the inlet to said discriminator being fed from said coupling device, and the outlet from said discriminator being connected to deliver a frequency-controlling signal to said oscillator control input.

7. An AFC device according to claim 6, wherein said microwave resonators have resonant frequencies which vary in opposite directions with changes in temperature.

* * * * *